(12) United States Patent
Krames et al.

(10) Patent No.: US 8,450,754 B2
(45) Date of Patent: May 28, 2013

(54) SERIES CONNECTED FLIP CHIP LEDS WITH GROWTH SUBSTRATE REMOVED

(75) Inventors: Michael R. Krames, Los Altos, CA (US); John E. Epler, San Jose, CA (US); Daniel A. Steigerwald, Cupertino, CA (US); Tal Margalith, Pleasanton, CA (US)

(73) Assignees: Koninklijke Philips Electronics N.V., Eindhoven (NL); Philips Lumileds Lighting Company, LLC, San Jose, CA (US)

( * ) Notice: Subject to any disclaimer, the term of this patent is extended or adjusted under 35 U.S.C. 154(b) by 0 days.

(21) Appl. No.: 13/269,669

(22) Filed: Oct. 10, 2011

(65) Prior Publication Data

US 2012/0025231 A1 Feb. 2, 2012

Related U.S. Application Data

(62) Division of application No. 12/266,162, filed on Nov. 6, 2008, now Pat. No. 8,062,916.

(51) Int. Cl.
    *H01L 29/18* (2006.01)
(52) U.S. Cl.
    USPC ............ 257/88; 257/99; 257/E33.057

(58) Field of Classification Search
    USPC ................ 257/88, 99, E33.057
    See application file for complete search history.

(56) References Cited

U.S. PATENT DOCUMENTS

| 6,547,249 B2 | 4/2003 | Collins, III et al. |
| 2003/0020084 A1 | 1/2003 | Fan et al. |
| 2008/0211416 A1 | 9/2008 | Negley et al. |
| 2008/0230789 A1 | 9/2008 | Onushkin et al. |

FOREIGN PATENT DOCUMENTS

EP  1596442 A2  11/2005

OTHER PUBLICATIONS

International Search Report, PCT/IB2009/054809.

*Primary Examiner* — Minh-Loan T Tran

(57) ABSTRACT

LED layers are grown over a sapphire substrate. Individual flip chip LEDs are formed by trenching or masked ion implantation. Modules containing a plurality of LEDs are diced and mounted on a submount wafer. A submount metal pattern or a metal pattern formed on the LEDs connects the LEDs in a module in series. The growth substrate is then removed, such as by laser lift-off. A semi-insulating layer is formed, prior to or after mounting, that mechanically connects the LEDs together. The semi-insulating layer may be formed by ion implantation of a layer between the substrate and the LED layers. PEC etching of the semi-insulating layer, exposed after substrate removal, may be performed by biasing the semi-insulating layer. The submount is then diced to create LED modules containing series-connected LEDs.

19 Claims, 8 Drawing Sheets

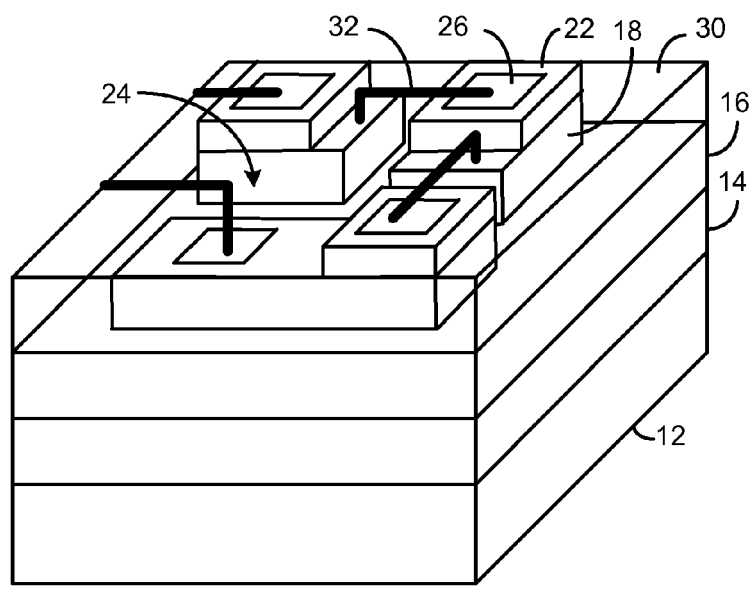
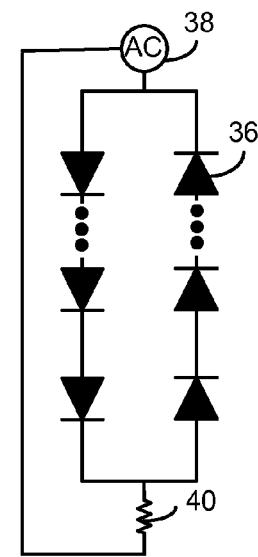
Fig. 3        Fig. 4
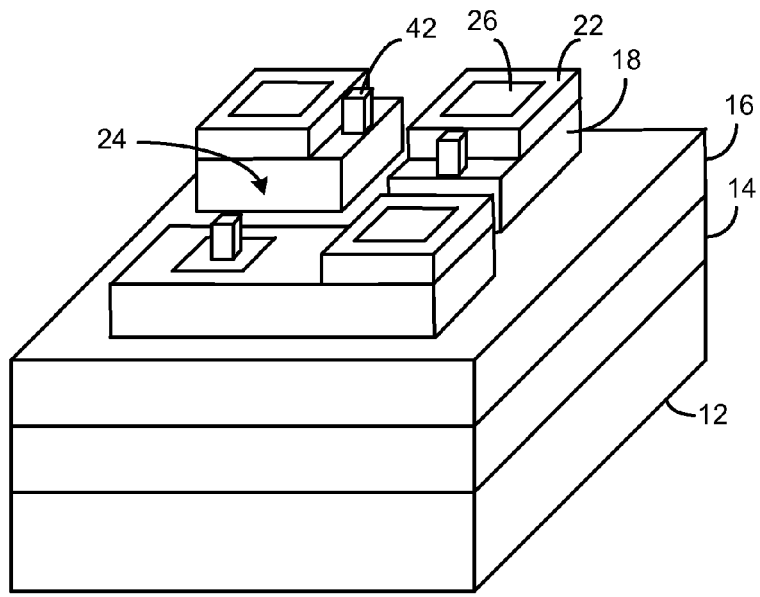
Fig. 5

SERIES CONNECTED FLIP CHIP LEDS WITH GROWTH SUBSTRATE REMOVED

This application is a Divisional of U.S. patent application Ser. No. 12/266,162, filed 6 Nov. 2008 and is incorporated by reference herein.

FIELD OF THE INVENTION

This invention relates to forming light emitting diodes (LEDs) and, in particular, to a method for simultaneously forming interconnected LEDs.

BACKGROUND

Individual LEDs have been connected in series across a mains voltage (e.g., 120 VAC) so that the combined forward voltages of the LEDs are slightly less than the peak voltage. Therefore, the LEDs briefly turn on each AC cycle. The rapid blinking of the LEDs is not perceived by the human eye. Such a light source is inexpensive since no DC current regulator is needed. However, since many LEDs are used (typically 30-60), mounting and interconnecting individual LEDs on a circuit board creates a relatively large light emitter.

Serially-connected LEDs are also useful for DC applications, such as automobiles, where parallel strings of three LEDs are connected across the battery voltage (nominally 12 volts) to create any brightness level.

A series resistor is typically used to limit the current in such LED strings not using an active current source. The LEDs may be any color and may even have a phosphor coating to generate white light.

Recently, the efficiency of GaN LEDs has been increased by the removal of the transparent sapphire growth substrate, used to grow GaN LED layers. After the removal of the substrate, the exposed GaN layer is etched to thin the layer and to create a roughened surface to increase light extraction.

What is needed is an efficient technique to form series LEDs in a compact structure. What is also needed is such a compact LED structure that can reliably undergo the substrate removal process. What is also needed is such a compact LED structure that can also reliably undergo the etching process, after substrate removal, to increase light extraction.

SUMMARY

A wafer-scale process is described that forms any number of serially connected LEDs on a single submount. In one embodiment, a string of blue LEDs with an overlying phosphor layer is fabricated to generate any color.

In one embodiment, a sapphire growth substrate wafer has epitaxially grown over it a semi-insulating (SI) GaN layer that is relatively thick. The resistivity of the SI-GaN layer is controlled by doping to have a resistivity on the order of $10^5$-$10^6$ ohm-cm. N-GaN layers are grown over the SI-GaN layer, followed by an active layer and P-GaN layers. Trenches are etched through the LED layers until the trench reaches the SI-GaN layer. The trenches create an X-Y grid to form an array of isolated LEDs. All the GaN layers are transparent.

The LEDs may be interconnected by a metal layer deposited over the LEDs to form the serial connection between any number of LEDs. Alternatively, the serial connection may be achieved by a metal pattern on a submount. The LEDs may also be connected in both series and parallel, or in another arrangement.

In one embodiment, groups of LEDs that are intended to be in a single module of serially-connected LEDs are separated out, such as by sawing the sapphire substrate to separate out the modules. Each LED module, supported by a portion of the sapphire substrate and the SI-GaN layer, is then mounted on the submount wafer. The LEDs are formed as flip-chips so that the sapphire substrate is face up, opposite to the submount surface. Alternatively, prior to dicing, the wafer is aligned with and metal-bonded to the submount wafer.

The sapphire substrate is then removed from each module on the submount wafer by a laser lift-off process. The laser causes the top layer of GaN to release a gas to push off the sapphire substrate from the GaN layer. The laser lift-off process generates a large downward pressure on the LED layers. The thick SI-GaN layer mechanically supports the thin N-GaN, active, and P-GaN layers during the lift-off process to prevent breakage. Once the substrate has been removed, the SI-GaN layer continues to provide mechanical support to the individual LEDs since it mechanically connects them together yet does not adversely electrically connect them.

To thin the LEDs and improve the light extraction through the top GaN layers, a photo-electrochemical (PEC) etch of the exposed surface is performed. A PEC etch involves electrically biasing the material to be etched, immersing the material in a base solution, and exposing the material to UV light. The submount has a grounded metal trace pattern that contacts the N-GaN layer of the LEDs, where the metal pattern is just used to electrically bias the SI-GaN layer through the N-GaN layer during the PEC etch process. The SI-GaN layer has a resistance that is sufficiently high so as to not short out the series LEDs but sufficiently low to allow the SI-GaN layer to be electrically biased during the PEC etch. Without doping the GaN layer to create the SI-GaN layer, the resistance would be too high to efficiently conduct the PEC etch. After the PEC etch, the metal traces on the submount used for the biasing are cut or blown. A PEC etch is optional.

In another embodiment, instead of growing a SI-GaN layer, a P-type or N-type or undoped GaN layer is grown on the sapphire substrate, followed by a blanket ion implant. The ion implant creates defects in the crystalline structure of the GaN layer, making it semi-insulating. The normal LED layers are then grown over the SI-GaN layer. The LED layers are then trenched down to the SI-GaN layer to electrically isolate the individual LEDs. The LEDs/substrate are then diced to create the LED modules with series-connected LEDs, and the LEDs are then mounted as flip chips onto a submount wafer. The substrate is then removed from each of the modules on the submount wafer by laser lift-off. The LEDs for a module are connected in series by a metal pattern. The SI-GaN layer helps provides mechanical support to the LEDs during substrate lift off and after the substrate is removed. An optional PEC etch of the exposed surface may then be performed by biasing the SI-GaN layer during the PEC etch.

In another embodiment, LED layers are grown on the substrate. Trenches are then formed through the P-layers and active layer and only part way through the N-layers. After dicing to separate the LED modules, the LEDs are then mounted as flip chips onto a submount wafer, and the substrate is removed by laser lift-off. The LEDs for a module are connected in series by a metal pattern. The exposed surface is then ion implanted down to where the trenches ended so that the top portion of the N-layers is semi-insulating. The semi-insulating portion mechanically connects the LEDs together for support. An optional PEC etch of the exposed surface may then be performed by biasing the surface layer during the PEC etch.

In another embodiment, LED layers are grown on the substrate, and the layers are masked to expose the boundaries between LEDs. Ions are then implanted into the boundary regions of the LEDs through the P-layers, active layer, and N-layers to render those portions of the LED layers semi-insulating. No trenching is needed for electrically isolating the LEDs. Since there is no trenching, the LEDs are mechanically connected together by the ion implanted areas after the growth substrate is removed. The LEDs are connected together in a serial configuration by a metal pattern. The exposed surface of the LEDs, after mounting on the submount, may optionally be subjected to the PEC etch while biasing the exposed layer. The ion implanted areas occupy a small percentage of the surface area at the edges of the active device and need not be roughened to achieve good light extraction.

After the optional PEC etch, a phosphor layer may then be deposited over the LEDs, where the phosphor layer combined with blue light leaking through creates any color of light.

The submount wafer is then diced to separate the LED modules or units that contain any number of serially connected LEDs. An AC voltage or a high DC voltage may be connected to submount electrodes to energize a string of LEDs.

Aspects of the process may be applied to LEDs that are not GaN, such as AlInGaP LEDs. Any suitable substrate, such as a GaN substrate, may be used to grow the various layers.

BRIEF DESCRIPTION OF THE DRAWINGS

FIG. 3 illustrates the wafer-level metallization to form serial connections between the LEDs.

FIG. 4 is a schematic view representing any number of LEDs connected in series.

FIG. 5 illustrates an alternative to FIG. 3, where co-planer bonding pads on the LEDs are formed for connection to a metal pattern on a submount, where the metal pattern on the submount creates the serial connection between the LEDs.

Elements identified by the same numeral in the various figures are the same or similar.

DETAILED DESCRIPTION

Figure 1:
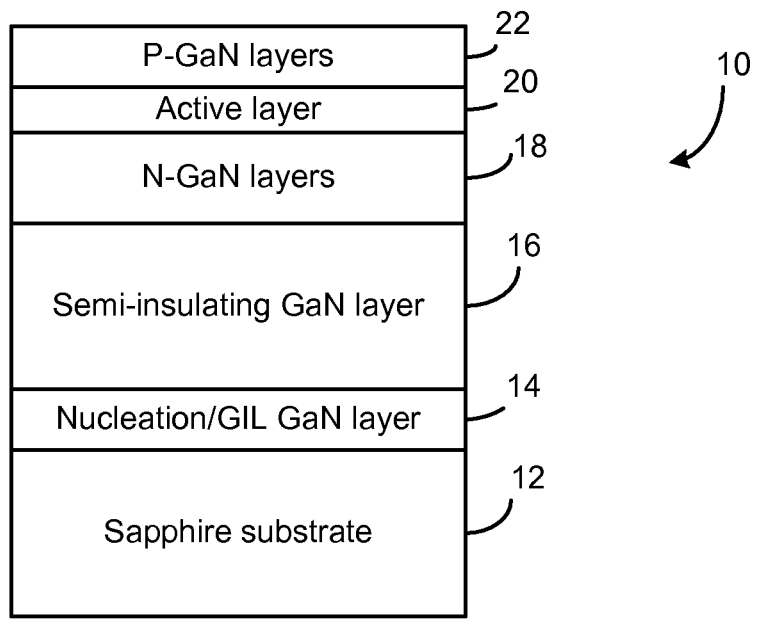
FIG. 1 is a simplified cross-sectional view of a blue LED formed in accordance with one embodiment of the invention.

FIG. 1 is a simplified cross-sectional view of an LED 10 formed in accordance with one embodiment of the invention. In the examples, blue LEDs are formed on a wafer. However, other types of LEDs may be formed instead, such as AlInGaP LEDs. All the layers are epitaxially grown.

On a sapphire substrate 12 is grown a conventional GaN nucleation layer, a growth initiation layer (GIL), and a coalescence layer, all represented by the layer 14. Such layers are generally used to provide a transition between the sapphire substrate 12 lattice constant and the LED layers' GaN lattice constant to minimize the defect density in the crystalline structure of the critical N-GaN, active, and P-GaN layers. Forming such transition layers are described in U.S. Pat. Nos. 6,989,555 and 6,630,692, assigned to the present assignee and incorporated by reference.

Over layer 14 is grown a thick semi-insulating (SI) GaN layer 16. The SI-GaN layer 16 performs at least two functions. It provides mechanical support for the LED layers during a substrate laser lift-off process, and it is electrically biased for a photo-electrochemical (PEC) etch process while not being sufficiently conductive to short out the LEDs. In one embodiment, the layer 16 is 2 microns thick or greater. The resistance of the SI-GaN layer 16 may be controlled by doping using Fe or Mg. A SI-GaN layer is described in the paper, "Electrical and Optical Properties of Fe-Doped Semi-Insulating GaN Templates," by A. Y. Polyakov, Appl. Phys. Lett. 83, 3314 (2003), incorporated herein by reference.

The resistivity of the layer 16 should be chosen to provide adequate electrical isolation between LEDs (after a trench is formed between the LEDs) yet allow a current of about 10 uA per $mm^2$ to flow with a voltage of approximately 0.1 volt. Such characteristics are needed during a PEC etch, described later. A resistivity of 100 Kohm-cm would be adequate. An acceptable range of resistivity may be $10^4$-$10^6$ ohm-cm. The voltage between neighboring LEDs (after a trench is formed) would be about 4 volts and, therefore, a leakage current across a 10 um wide trench would be about 8 uA per element.

If instead of a string of LEDs, a two dimensional array of LEDs are connected in series, then the leakage current would be higher as the average voltage difference between devices and the number of neighboring devices would be greater. However for practical embodiments, a SI-GaN resistivity on the order of about $10^5$ ohm-cm would only permit a sub-mA leakage current Over the layer 16 are formed conventional N-GaN confining layers 18, a conventional active layer 20, and conventional P-GaN confining layers 22. In one embodiment, the active layer 20 is AlInGaN and generates blue light.

Figure 2:
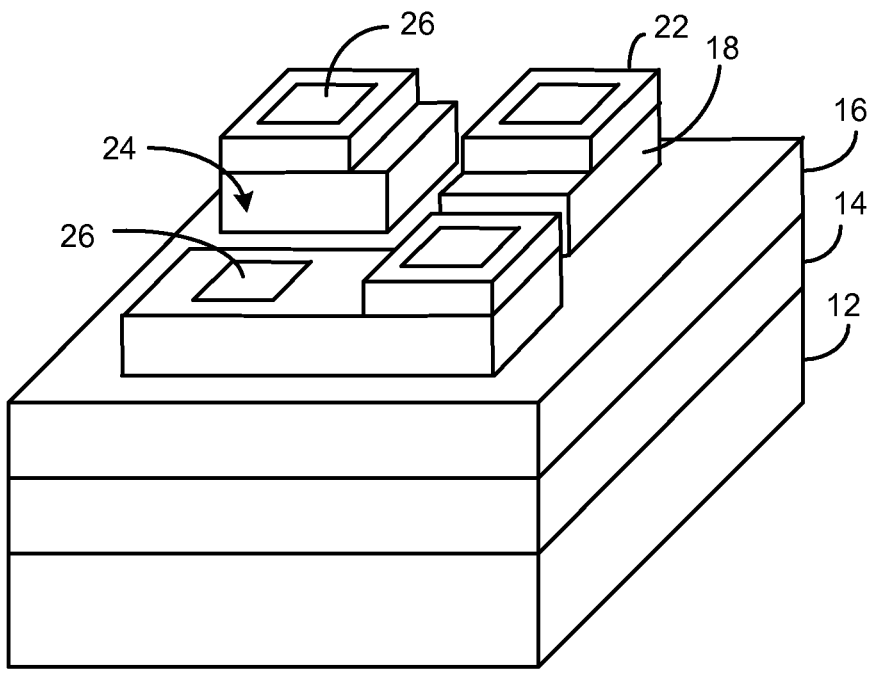
FIG. 2 is a simplified perspective view of a small portion of a wafer showing three LEDs formed on it and isolated using trenches.

Since the LEDs are to be flip-chips, with the N and P contacts on the surface of the LEDs facing the submount, the P-layers are masked and etched to expose portions of the underlying N-layer. Then, as shown in FIG. 2, trenches 24 are etched between LED portions using reactive ion etching. Etching trenches to isolate GaN LEDs is described in U.S. Pat. No. 6,547,249, assigned to the present assignee and incorporated herein by reference. The trenches 24 are etched down to the SI-GaN layer 16.

Metal ohmic contacts 26 to the P and N semiconductor layers are formed before or after the trenches 24 are formed.

Although only three isolated LEDs are shown in FIG. 2 for simplicity, there will normally be many hundreds of isolated LEDs simultaneously created on the same growth substrate.

FIG. 3 illustrates a metallization process for interconnecting the LEDs in one embodiment. A planarized insulating layer 30 may be formed over the surface to fill the trenches 24 and create a substantially flat surface. $Si_2N_3$ or other dielectric may be deposited. The insulating layer 30 is masked and etched to expose the ohmic contacts 26 on the N and P layers. A metal is then deposited, such as an aluminum alloy, to create serial interconnections 32 between the LEDs. The interconnections 32 are shown schematically for simplicity. In an actual embodiment, wider metal strips would make the interconnections.

FIG. 4 is a schematic of a possible serial connection between the individual LEDs 36 that may be made by the interconnections 32. Any number of LEDs 36 may be connected in series and in parallel to achieve the required forward voltage drop and brightness. An AC source 38 is shown coupled to the serial strings. Since the AC voltage is assumed to go positive and negative during each cycle, the LED strings are connected in an anti-parallel configuration, so that the strings alternately turn on. The LEDs 36 in a string will turn on when the AC voltage rises above the forward voltage. A current limiting resistor 40 sets the maximum current through each string. If the AC source is the mains voltage (e.g., 120 volts, 220 volts, etc.), there may 30 or more LEDs 36 in a string. In another embodiment, a full wave bridge rectifier is formed using silicon diodes to create a rectified signal, and a series string of LEDs is driven by the rectified signal. Such an embodiment uses half the number of LEDs as an anti-parallel configuration for the same brightness output. The rectifier may be formed on the submount.

As an alternative to depositing the metal interconnections on the LEDs, the interconnections may be a metal pattern on a submount. FIG. 5 illustrates raising all the N-metal contacts 42 to be coplanar with the P-metal contacts 26 so the interconnections can be made by the submount trace pattern. An insulating layer, similar to that shown in FIG. 3, may first be formed, followed by depositing the raised metal contacts 42 into openings in the insulation layer. The submount interconnection pattern may resemble the pattern of the interconnections 32 in FIG. 3.

The LEDs/substrate is then diced, such as by sawing or scribe-and-break, to form modules of LEDs, containing any number of LEDs. Each module may be rectangular to simplify the sawing process. Each module would later be packaged in a single package after all other processing.

Figure 6:
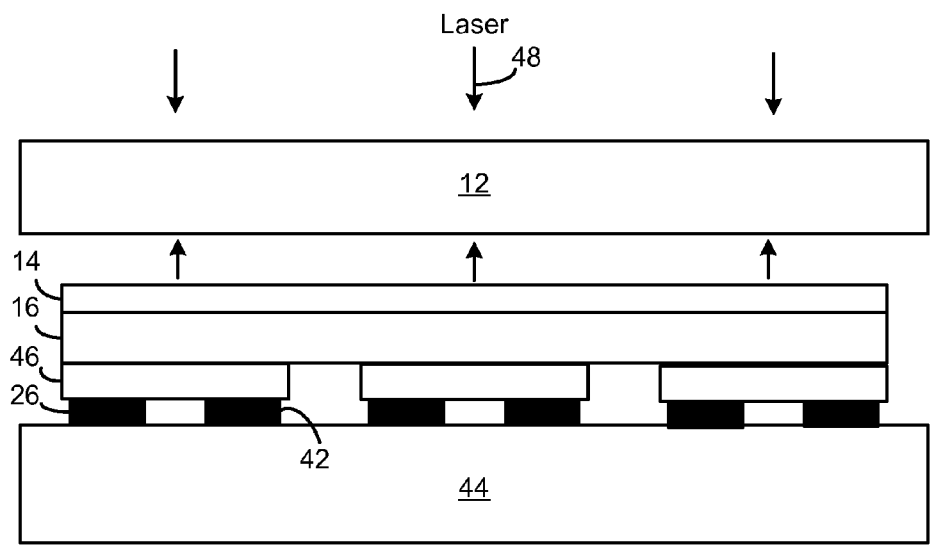
FIG. 6 illustrates a laser lift-off process to remove the sapphire substrate after the LEDs have been mounted on a submount wafer.

In FIG. 6, the separated modules from the structure of FIG. 3 or 5 are then mounted on a submount wafer 44. Only one simplified module in shown in FIG. 6 on a portion of the submount wafer 44.

A metal pattern on the submount wafer 44 leads from the LED metal contacts 26/42 to more robust metal pads for connection to a circuit board. Pads on the submount wafer 44 are bonded to corresponding pads on the LEDs by either ultrasonic welding, soldering, or other method. Gold bumps may act as an interface metal. Bonding LEDs to a submount is conventional.

In FIG. 6, the N-layers, the active layer, and the P-layers are shown as layer 46. The sapphire substrate 12 is removed by laser lift-off. The laser energy is shown by arrows 48. The photon energy of the laser (e.g., an excimer laser) is selected to be above the band gap of the LED material and below the absorption edge of the sapphire substrate (e.g., between 3.44 eV and 6 eV). A pulse from the laser through the sapphire is converted to thermal energy within the first 100 nm of the LED material. The generated temperature is in excess of 1000° C. and dissociates the gallium and nitrogen. The resulting high gas pressure pushes the substrate away from the epitaxial layers to release the substrate from the layers, and the loose substrate is then simply removed from the LED structure. The presence of the SI-GaN layer 16 blocks the laser radiation from reaching the submount surface in the region between the LEDs so as to prevent potential damage to the submount.

The mechanical support provided by the thick SI-GaN layer 16 prevents the tremendous downward pressure on the LED layers 46 from cracking the LED layers 46. The SI-GaN layer 16 also provides mechanical support of the individual LEDs after the growth substrate 12 is removed.

The growth substrate 12 may instead be removed by etching, such as reactive ion etching (RIE), CMP, or grinding. Suitable substrate removal techniques are described in U.S. Pat. No. 7,256,483, entitled, Package-Integrated Thin Film LED, by John Epler et al., incorporated herein by reference.

After the growth substrate is removed, the exposed surface of the layer 14 or layer 16 is not optimal for light extraction through the surface. For thinning the LED and to achieve an optimal roughened surface of the layer 16, photo-electrochemical (PEC) etching is used. Removal of the layer 14 prior to PEC is optional since the electrical field created between the SI-GaN layer 16 and the base solution (described below) would still exist with the layer 14 in-between. The layer 14 may be removed by PEC etching or non-PEC etching, such as by RIE, CMP, or grinding, to reveal the SI-GaN layer 16.

In PEC etching, an electric field should be created between the surface to be etched and the solution to increase the rate of etching and control the etch rate. To enable such biasing, a sacrificial thin metal pattern is provided on the submount for grounding the SI-GaN layer 16 via the N-layer 18 metal contacts.

Figure 7:
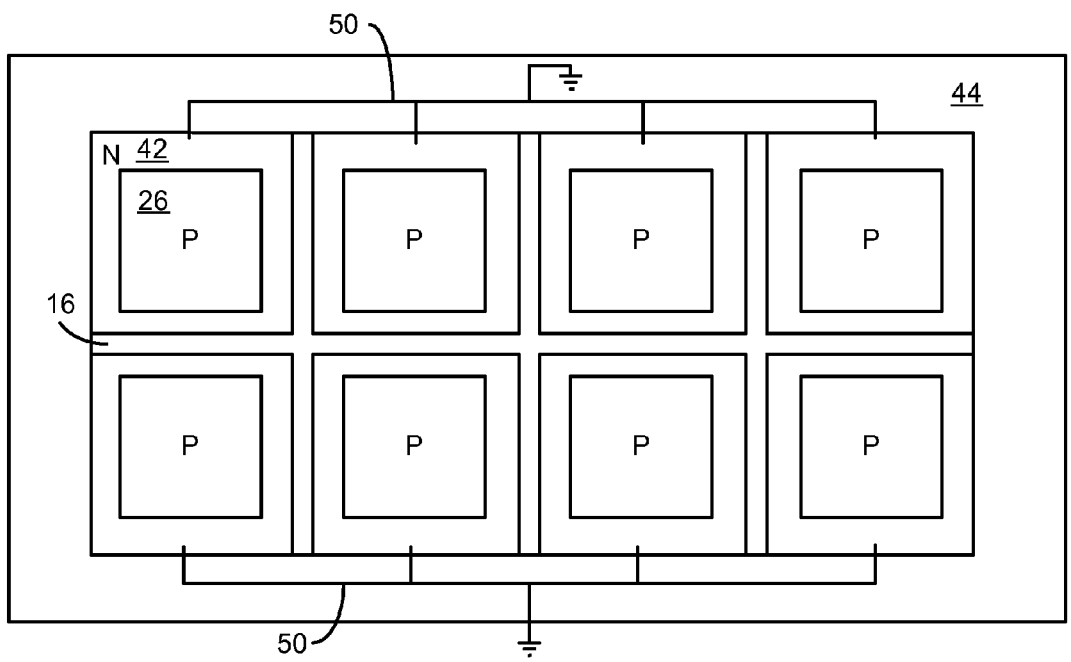
FIG. 7 is a top down view of one example of the layout of six LEDs on the submount, showing the areas of the P-metal and N-metal ohmic contacts on the LEDs bonded to a metal pattern on the submount. Only the grounded metal pattern for temporarily connecting the SI-GaN layer to a bias voltage during a PEC etch is shown for simplicity.

FIG. 7 is a top down view of a portion of the submount wafer 44 supporting a single LED module of eight LEDs, showing the P and N contacts 26/42 on the LEDs, the SI-GaN layer 16 connecting the LEDs, and the sacrificial metal pattern 50 on the submount wafer 44. The pattern of the P and N contacts in FIG. 7 shows the N contact 42 surrounding the P contact 26 for symmetrical current flow through the active layer. In previous embodiments, the representation of the N and P contacts was simplified. The SI-GaN layer 16 is connected to ground, via the metal pattern 50 and N-layer, at many distributed points, otherwise the high resistance would prevent uniform biasing of the layer 16, and an uneven PEC etching would occur.

Figure 8:
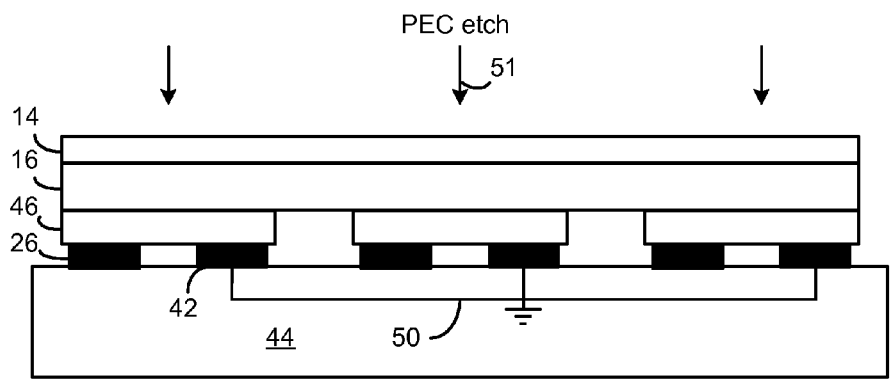
FIG. 8 is a side view showing the top layer of the LEDs, mounted on the submount wafer, undergoing a PEC etch to improve light extraction, while the SI-GaN layer is electrically biased.

In FIG. 8, the PEC etch 51 of the exposed surface of layer 14 or 16 is performed. At least layer 14 is etched through during the PEC etch. To perform the PEC etching, at least the layer to be etched is immersed in a base solution, and an electrode with a positive potential is immersed in the base solution. An example of a suitable base solution is 0.2 M KOH, though many other suitable basic or acidic solutions may be used and depend on the composition of the material to be etched and the desired surface texture. The epitaxial surface of the GaN layer 14/16 is exposed to light with energy greater than the band gap of the surface layer. In one example, ultraviolet light with a wavelength of about 365 nm and an intensity between about 10 and about 100 mW/cm$^2$ is used. Exposure to the light generates electron-hole pairs in the surface semiconductor layer. The holes migrate to the surface of the GaN layer under the influence of the electric field. The holes then react with the GaN at the surface and base solution to break the GaN bonds, according to the equation $2\,GaN + 6OH^- + 6e^+ = 2Ga(OH)_3 + N_2$. The current through the SI-GaN layer 16 is about 10 uA for a 1×1 mm$^2$ LED. The PEC voltage should be kept below the diode breakdown voltage (e.g., below 5 volts). Additional detail of PEC etching of a GaN layer may be found in US publication 20060014310, by John Epler, assigned to the present assignee and incorporated herein by reference.

The resulting roughening of the surface of layer 16 reduces the internal reflections within the LED structure to increase efficiency.

After the PEC etch, a laser may be used to cut the metal pattern 50 (FIG. 7) so that the N-contacts are no longer shorted together and connected to ground. Alternatively, a sufficiently high pulse of current may be passed through the pattern 50 to burn out the thin metal.

Figure 9:
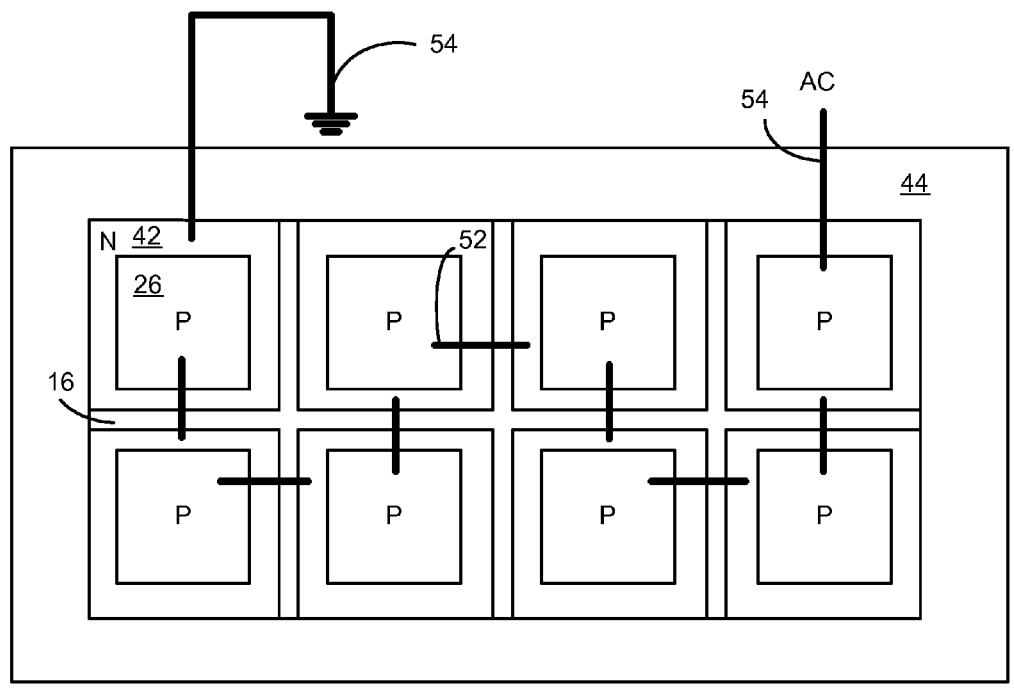
FIG. 9 is the same view as in FIG. 7 but showing a schematic representation of the serial connection between the LEDs provided by a metal pattern on the submount. The biasing traces shown in FIG. 7 have been cut or blown.

FIG. 9 is the same view as in FIG. 7 but shows the interconnects 52 between the LEDs formed by either a metal pattern deposited on the LEDs (FIG. 3) or a metal pattern formed on the submount wafer 44 for contacting the P and N metal contacts 26/42 on the LEDs (FIG. 5). It is preferred to interconnect the LEDs so that there are no large voltage differences between adjacent LEDs. Leads 54 on the submount wafer 44 extend beyond the LEDs for connection to a power supply, such as an AC or DC supply. The leads 54 may be on the same surface as the LEDs or on the bottom surface of the submount wafer 44 for direct connection to pads on a circuit board.

Wafer level phosphor deposition and encapsulation may be performed by molding, deposition, or other technique. If the LEDs emit blue light, the phosphor layer can contain green and red phosphors so that the combination of the leaked blue light with the green and red light creates white light. A yellow-green YAG phosphor may be used instead. A lens may be formed over each LED module by molding.

The submount wafer 44 is then diced, such as by sawing or scribe and break, to create modules containing LEDs connected in series, where the LEDs in a module are mechanically coupled together by the SI-GaN layer 16. The modules may then be packaged.

Figure 10:
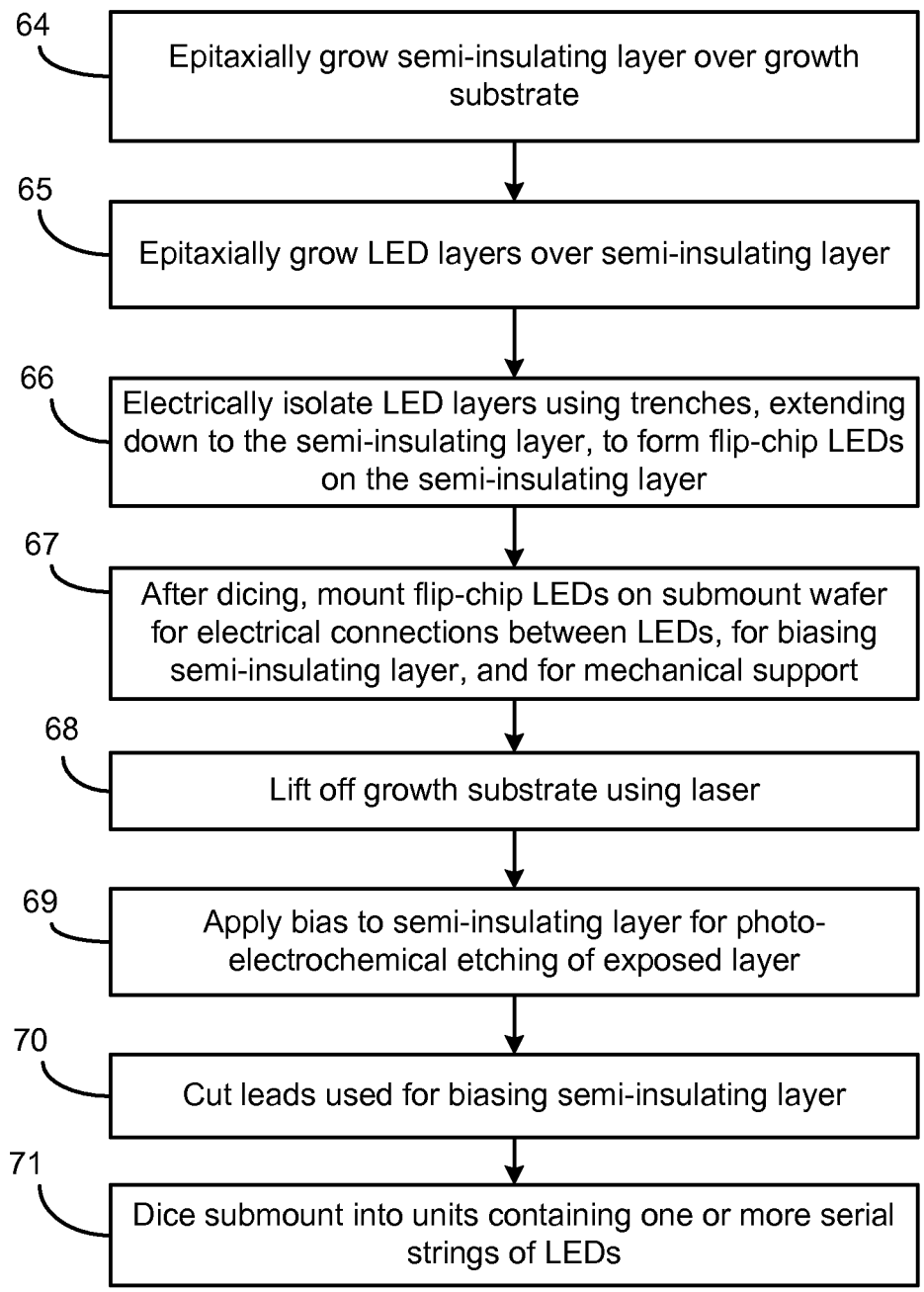
FIG. 10 is a flowchart showing various steps used in one embodiment of the invention, where trenches, in conjunction with a semi-insulating layer, is used to isolate the LEDs.

FIG. 10 is a flowchart identifying various steps used in one embodiment of the invention.

In step 64, a thick semi-insulating layer is epitaxially grown over a sapphire substrate. The resistance of the semi-insulating layer is carefully controlled to conduct current but not short out the later-formed LEDs.

In step 65, the LED layers are epitaxially grown over the semi-insulating layer.

In step 66, LEDs are electrically isolated from each other by trenches through the LED layers but not extending through the semi-insulating layer. The thick semi-insulating layer helps keeps the individual LEDs aligned after the sapphire substrate is later removed, especially if the submount is flexible. Further, if the submount undergoes high temperature processing, the semi-insulating layer resists misalignment of the LEDs resulting from any metal creep. Still further, since the semi-insulating layer covers the edges of each individual LED, and edges of a die are the most vulnerable to humidity, the semi-insulating layer reduces this vulnerability. Each LED is a flip-chip (both P and N contacts on surface facing away from light extraction surface). Optionally, the sapphire substrate is sawed to separate out LED modules, each module containing LEDs that are to be in a single package.

In step 67, after dicing the LED modules, the flip-chip LEDs are mounted on a submount wafer. The submount may electrically interconnect the LEDs in series, or in both series and parallel, or some other arrangement. The submount also has metal traces for biasing the common semi-insulating layer for a PEC etch. The submount wafer also provides mechanical support for the LEDs.

In step 68, the sapphire substrate is removed, such as by laser lift-off.

In step 69, a bias voltage (e.g., ground) is applied to the semi-insulating layer via the N-contacts of the LED layers during a PEC etch of the exposed layer. Leads on the submount wafer may be used for applying the bias voltage to the semi-insulating layer.

In step 70, the leads on the submount wafer for biasing the semi-insulating layer are cut or blown.

In step 71, the submount wafer is diced to form LED modules or units, each module containing a group of interconnected LEDs, such as containing one or more strings of LEDs for coupling to a relatively high voltage supply.

Figure 11A:
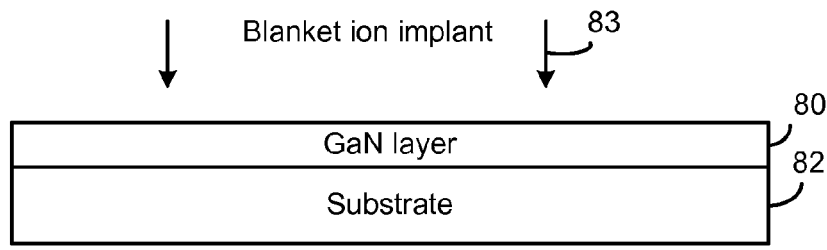
FIG. 11A illustrates another embodiment where ions are implanted in a GaN layer to create a semi-insulating layer.

FIG. 11A illustrates a GaN layer 80 grown over a sapphire substrate 82. The layer 80 thickness may be between 0.5-4 microns, and the thickness is not critical. The layer may be P-type, N-type, or undoped. Ion implantation is then performed to implant ions 83 into the layer 80. The ion implantation makes the layer 80 semi-insulating by creating defects in the crystalline structure of the layer 80. The ion (proton) implantation is conducted with an approximate dose and energy of 8E13 cm$^{-2}$ and 400 keV, respectively, for a 4 micron thick epi layer. The optimum dose and energy are determined experimentally and may vary by +/−50% from these values (e.g., depending on the layer thickness). The dose and energy should be optimized to achieve sufficient isolation while minimizing implant induced optical absorption. Species include (but are not limited to) He, Zn, Al, and Mg. Ion implantation for creating an insulating region in GaN material is well known in the art.

Figure 11B:
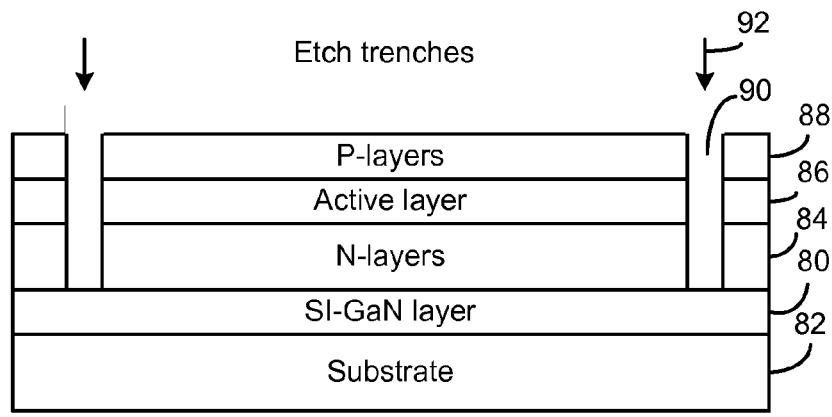
FIG. 11B illustrates the structure of FIG. 11A after LED layers are formed over the semi-insulating layer and after trenches are formed to isolate individual LEDs.

As shown in FIG. 11B, one or more thick N-layers 84 are then grown over layer 80, followed by growing an active layer 86 and P-layers 88.

Trenches 90 are then formed through the LED layers 88, 86, and 84 down to the semi-insulating GaN layer 80. The etching is performed using a photoresist mask followed by reactive ion etching 92 (RIE). The trenches 90 isolate the LEDs, such as in FIGS. 2 and 7, so the LEDs can later be connected together in series. The SI-GaN layer 80 has a very high resistivity so does not affect the series configuration. Any etching needed to form flip chips is also performed.

Figure 11C:
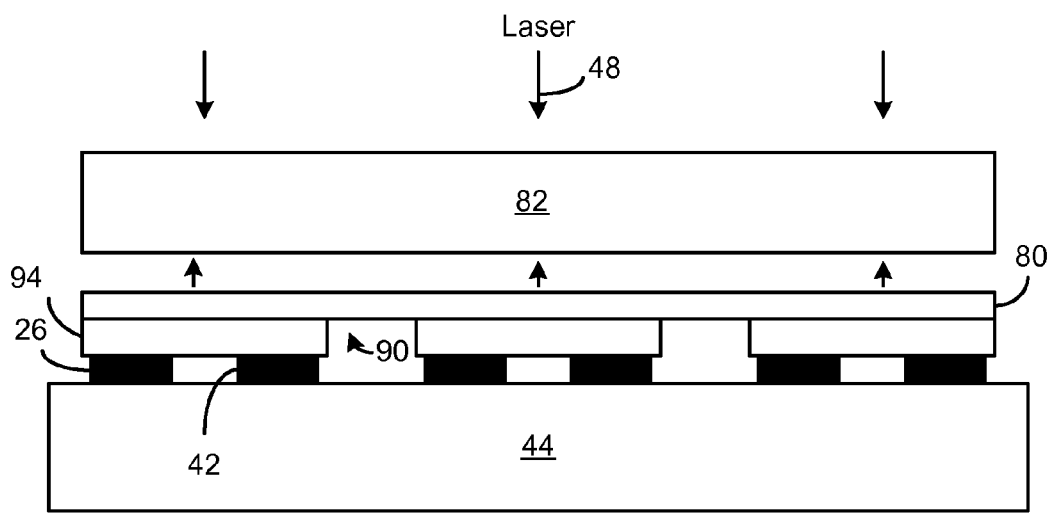
FIG. 11C illustrates the structure of FIG. 11B after being mounted to a submount and after the substrate is removed.

As shown in FIG. 11C, metal contacts 26 and 42 are formed to contact the P and N layers of the isolated LEDs. The LED modules are then diced, and the LEDs are mounted on a submount 44. One module is shown in FIG. 11C. The LED layers are shown as layer 94 for simplicity. The substrate 82 is lifted off using laser energy 48, as previously described. The LED layers may be supported for laser lift-off by making the metal contacts 26 and 42 between the LED layers and the submount wafer 44 cover a large portion of the bottom surface. The metal contacts may cover approximately 90% of the area under the LED layers. The SI-GaN layer 80 over the LED layers, after the substrate is removed, is electrically biased by a metal pattern on the submount, as previously described, and a PEC etch is performed to optimize light extraction. The widths of the trenches would be much smaller, relative to the size of the LEDs, than depicted in FIG. 11C. The SI-GaN layer 80 mechanically supports the LEDs while on the submount 44.

The remainder of the processing may be the same as previously described to create separated LED modules containing LEDs in series.

In all embodiments, an underfill (e.g., silicone) may be injected between the LEDs and the submount 44 to help support the LED layers and SI-GaN layer 80 during the laser lift-off and protect the LEDs.

Figure 12A:
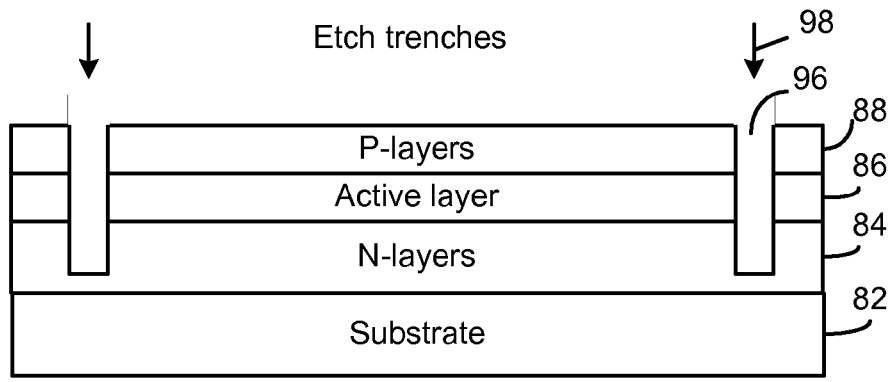
FIG. 12A illustrates another embodiment where LED layers are etched to form trenches that partially extend into the N-layers.
Figure 12B:
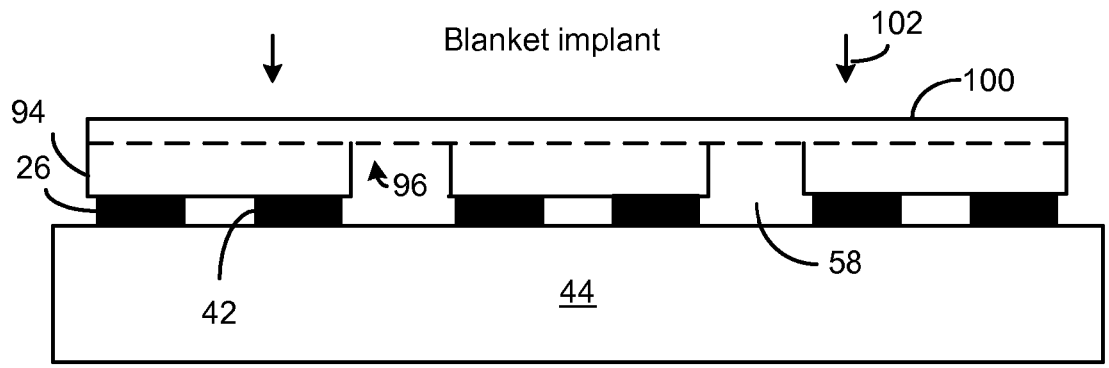
FIG. 12B illustrates the structure of FIG. 12A after being mounted on a submount, after the substrate is removed, and after an ion implant to make the top surface portion semi-insulating.

FIGS. 12A and 12B illustrate another process using ion implantation for creating a mechanically supporting layer between individual LEDs. In FIG. 12A, N-layers 84, the active layer 86, and P-layers 88 are grown over the substrate 82. Trenches 96 are formed through the P-layers 88 and active layer 86 and partially through the N-layers 84 using a mask and RIE 98. The trenches 96 isolate the individual LEDs, as previously mentioned.

In FIG. 12B, metal contacts 26 and 42 are formed to create flip chips and, after dicing, the LED modules are mounted on the submount wafer 44. The substrate is then removed using laser lift-off. The LED layers are shown as layer 94 for simplicity. The top surface 100 is then implanted with ions 102, using the same technique described with respect to FIG. 11A, so that the top of the N-layer is made semi-insulating down to where the trench 96 ends. The remainder of the processing to form series connected LEDs in a module is the same as in previous embodiments.

Figure 13:
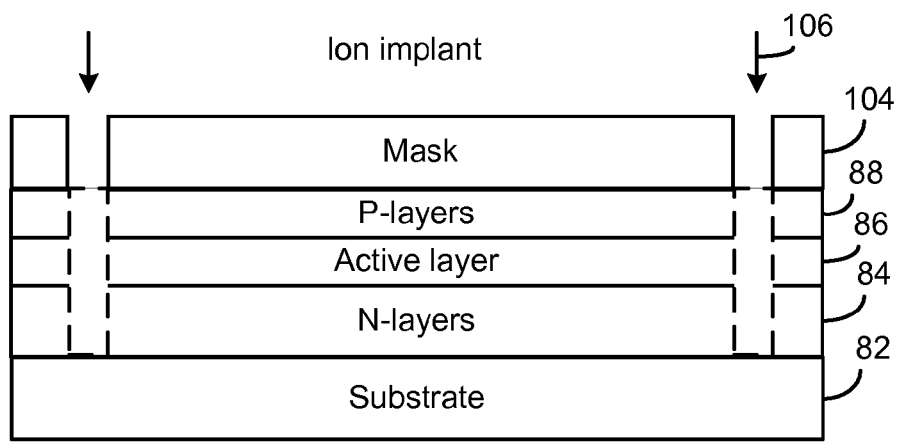
FIG. 13 illustrates another embodiment where a masked ion implantation through the LED layers down to the substrate isolates the individual LEDs.

FIG. 13 illustrates another embodiment where there are no trenches formed to isolate the LEDs. The LED layers 84, 86, and 88 are grown over the substrate 82. A photoresist mask 104 is then formed over the structure to expose regions that will be semi-insulating boundaries between individual LEDs. Ions 106 are then implanted at a high enough energy to create defects in the crystalline structure in the layers 84, 86, and 88 in the boundary areas to make those boundary areas semi-insulating to effectively electrically isolate the LEDs from each other. The mask 104 is then removed. As in previous embodiments, metal contacts are formed, the modules are diced, the modules are mounted on a submount wafer, the LEDs are connected in series, the substrate is removed, and the LED modules/submounts are separated out. The ion implanted areas occupy a small fraction, approximately 8%, of the emitting area at the border between devices and need not become roughened by the PEC process to achieve good light emission.

Phosphor deposition and encapsulation may be performed on a wafer scale (before dicing) as previously described.

Various other metal connections between the LEDs may be used other than a simple serial connection. The LEDs may be connected to a control circuit that dynamically changes the number of LEDs connected in series across an AC power supply based on the instantaneous voltage so that the LEDs are on for a longer time.

In all embodiments, the semi-insulating layers or regions should have a resistivity greater than about $10^4$ ohm-cm (greater than the resistivity of intrinsic GaN), but a lower resistivity may be an acceptable tradeoff to achieve less optical absorption due to the ion implantation.

Figure 14:
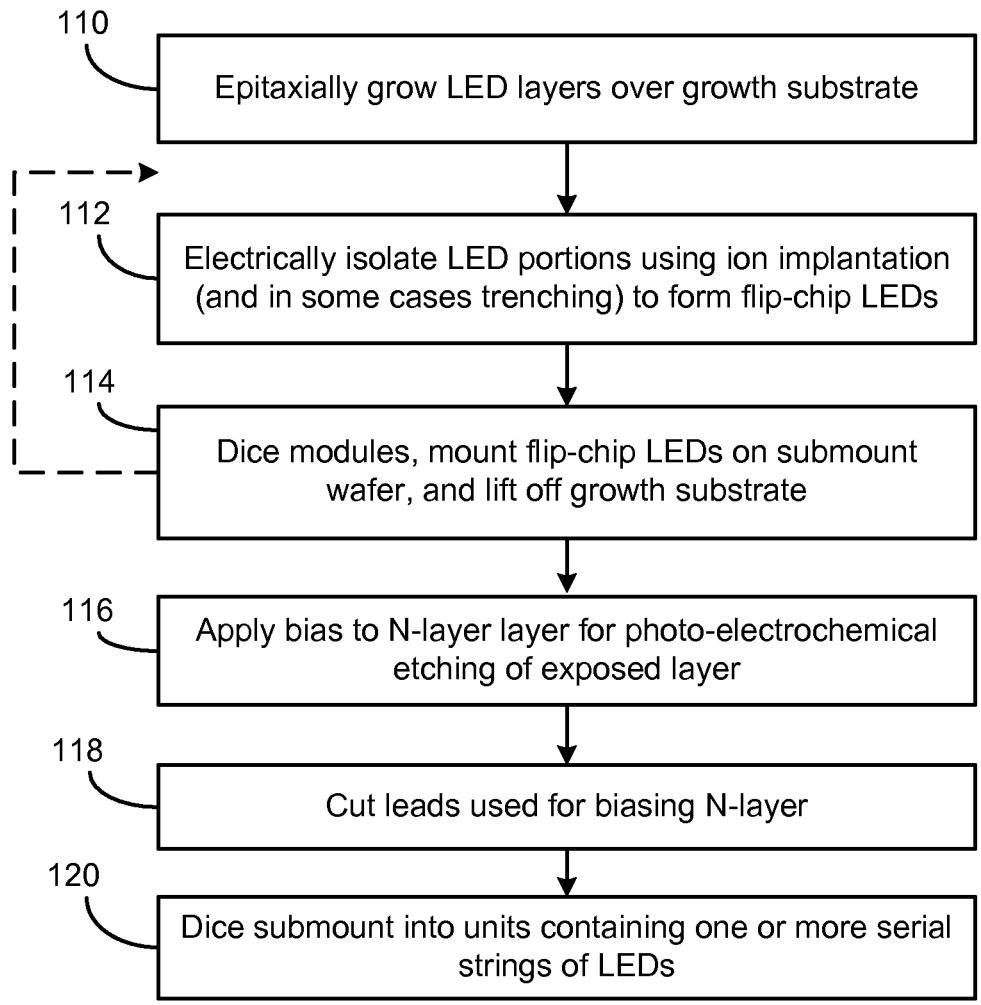
FIG. 14 is a flowchart showing various steps used in one embodiment of the invention where trenching and/or ion implantation is used to electrically isolate the LEDs.

FIG. 14 is a flowchart that broadly describes the processes that use ion implantation, with or without trenches, to electrically isolate the LEDs.

In step 110, the LED layers are epitaxially grown over a substrate.

In step 112, LEDs are electrically isolated from each other by ion implantation and, in some cases, trenches, as described with respect to FIGS. 11A through 13. In all cases, individual LEDs are mechanically connected together by a semi-insulating layer formed by ion implantation. The mechanical connection improves the robustness of the LEDs, helps align the LEDs, and provides additional support during substrate lift-off. Each LED is a flip-chip (both P and N contacts on surface facing away from light extraction surface).

In step 114, the modules are diced, and the flip-chip LEDs are mounted on a submount wafer. The submount may electrically interconnect the LEDs in series, or in both series and parallel, or some other arrangement. The submount also has metal traces for biasing the common semi-insulating layer (the top surface) for a PEC etch. The submount wafer also provides mechanical support for the LEDs. The sapphire substrate is removed, such as by laser lift-off.

The steps 112 and 114 may be reversed if the ion implantation occurs after substrate removal, as in FIG. 12B.

If PEC etching is needed, then, in step 116, a bias voltage (e.g., ground) is applied to the semi-insulating layer via the N-contacts of the LED layers during a PEC etch of the exposed layer. Leads on the submount wafer may be used for applying the bias voltage to the semi-insulating layer.

In step 118, the leads on the submount wafer for biasing the semi-insulating layer are cut or blown.

In step 120, the submount wafer is diced to form LED modules or units, each module containing a group of interconnected LEDs, such as containing one or more strings of LEDs for coupling to a relatively high voltage supply.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

The invention claimed is:

1. A module containing a plurality of light emitting devices (LEDs), the module comprising:
    electrically isolated individual LEDs, each LED including an N-layer, an active layer, and a P-layer;
    a semi-insulating isolation layer common to the individual LEDs that mechanically couples together the individual LEDs and has a resistivity between $10^4$ and $10^6$ $\Omega$-cm; and
    a metal pattern that connects the individual LEDs, at least two of the LEDs being connected together in series.

2. The module of claim 1 wherein the individual LEDs are separated by trenches formed at least through the P-layer and active layer.

3. The module of claim 1 wherein the individual LEDs are separated by semi-insulating isolation regions formed by ion implantation.

4. The module of claim 1 including a submount that supports the module of individual LEDs.

5. The module of claim 4 wherein the submount includes at least a portion of the metal pattern that connects the individual LEDs.

6. The module of claim 1 wherein the metal pattern connects the individual LEDs in a combination of series and parallel connections.

7. The module of claim 1 wherein the metal pattern connects the individual LEDs in an anti-parallel configuration, such that portions of the individual LEDs are alternatively activated during alternating positive and negative cycles of a power source.

8. The module of claim 1 wherein a surface of the semi-isolating layer is etched.

9. The module of claim 1 including a wavelength conversion layer.

10. A module containing a plurality of light emitting devices (LEDs), the module comprising:
electrically isolated individual LEDs, each LED including an N-layer, an active layer, and a P-layer;
a semi-insulating isolation layer common to the individual LEDs that mechanically couples together the individual LEDs; and
a metal pattern that connects the individual LEDs, at least two of the LEDs being connected to ether in series
wherein the semi-insulating layer includes a semiconductor layer with defects in a crystalline structure of the semiconductor layer.

11. A module containing a plurality of light emitting devices (LEDs), the module comprising:
electrically isolated individual LEDs, each LED including an N-layer, an active layer, and a P-layer;
a semi-insulating isolation layer common to the individual LEDs that mechanically couples together the individual LEDs; and
a metal pattern that connects the individual LEDs, at least two of the LEDs being connected together in series,
wherein the semi-insulating layer includes an ion-implanted semiconductor layer.

12. A wafer comprising:
a plurality of modules, each module including a plurality of electrically isolated individual light emitting devices (LEDs) and a metal pattern that connects the individual LEDs, at least two of the LEDs being connected together in series; and
a semi-insulating isolation layer common to the plurality of modules that mechanically couples together the modules and has a resistivity between $10^4$ and $10^6$ Ω-cm.

13. The wafer of claim 12 wherein the individual LEDs are epitaxially grown over the semi-insulating layer.

14. The wafer of claim 12 wherein the semi-insulating layer is at least two microns thick.

15. The wafer of claim 12 wherein the semi-insulating layer is sufficiently conductive to support a photo-electrochemical etch process while being sufficiently insulating to prevent conduction between the individual LEDs.

16. The wafer of claim 12 wherein the semi-insulating layer includes a semi-insulating GaN layer.

17. The wafer of claim 12 wherein a surface of the semi-insulating layer is photo-electrochemically etched.

18. The wafer of claim 12 including a wavelength conversion layer.

19. A wafer comprising:
a plurality of modules, each module including a plurality of electrically isolated individual light emitting devices (LEDs) and a metal pattern that connects the individual LEDs at least two of the LEDs being connected together in series; and
a semi-insulating isolation layer common to the plurality of modules that mechanically couples together the modules, wherein the semi-insulating layer includes an ion-implanted semiconductor layer.

* * * * *